US012259431B2

(12) United States Patent
Lin et al.

(10) Patent No.: US 12,259,431 B2
(45) Date of Patent: Mar. 25, 2025

(54) EXPERIMENTAL MULTIFUNCTIONAL POWER SUPPLY PROCESSING DEVICE AND EXPERIMENTAL DETECTION APPARATUS FOR CONNECTORS

(71) Applicant: GUANG'AN ELECTRICAL TESTING CENTER (GUANGDONG) CO., LTD, Guangdong (CN)

(72) Inventors: Zhili Lin, Guangdong (CN); Renxu Yang, Guangdong (CN); Di Chen, Guangdong (CN); Xiangrong Guo, Guangdong (CN); Chengxu Liu, Guangdong (CN); Guifen Ma, Guangdong (CN); Yong Pu, Guangdong (CN); Binhai Li, Guangdong (CN); Yatao Fang, Guangdong (CN)

(73) Assignee: GUANG'AN ELECTRICAL TESTING CENTER (GUANGDONG) CO., LTD., Dongguan (CN)

( * ) Notice: Subject to any disclaimer, the term of this patent is extended or adjusted under 35 U.S.C. 154(b) by 0 days.

(21) Appl. No.: 17/753,623

(22) PCT Filed: May 11, 2021

(86) PCT No.: PCT/CN2021/094227
§ 371 (c)(1),
(2) Date: Mar. 9, 2022

(87) PCT Pub. No.: WO2022/095407
PCT Pub. Date: May 12, 2022

(65) Prior Publication Data
US 2024/0044981 A1 Feb. 8, 2024

(30) Foreign Application Priority Data

Nov. 5, 2020 (CN) .......................... 202022543557.3

(51) Int. Cl.
*B23P 19/00* (2006.01)
*G01R 1/04* (2006.01)
(Continued)

(52) U.S. Cl.
CPC ....... *G01R 31/3274* (2013.01); *G01R 1/0416* (2013.01); *G01R 31/3275* (2013.01)

(58) Field of Classification Search
CPC ............ G01R 31/3272; G01R 31/3274; G01R 31/3275; G01R 1/0416; H02M 7/155
See application file for complete search history.

(56) References Cited

U.S. PATENT DOCUMENTS

| 10,739,837 | B2 * | 8/2020 | Cheng ................... G06F 1/3296 |
| 2005/0190583 | A1 * | 9/2005 | Morimoto ........... H02M 3/3376 363/24 |
| 2021/0089114 | A1 * | 3/2021 | Hureau ................. G06F 1/3296 |

* cited by examiner

*Primary Examiner* — Paul D Kim
(74) *Attorney, Agent, or Firm* — SHIMOKAJI IP

(57) ABSTRACT

A power supply processing device includes three electric control valve groups, a positive output terminal and a conversion control switch group. The conversion control switch group includes a selection switch group configured to selectively connect the current valve control components in each electric control valve group to the positive output terminal or the phase output terminal, and a connection switch group configured to connect or disconnect a current path between two electric control valve groups connected one another. In such a way, both AC experiments and DC experiments of high voltage and large capacity may be performed to the connectors without changing experimental site and experimental equipment, thereby effectively reducing the experimental cost.

10 Claims, 6 Drawing Sheets

(51) Int. Cl.
*G01R 31/327* (2006.01)
*H05K 13/04* (2006.01)

EXPERIMENTAL MULTIFUNCTIONAL POWER SUPPLY PROCESSING DEVICE AND EXPERIMENTAL DETECTION APPARATUS FOR CONNECTORS

FIELD OF THE INVENTION

The invention relates to the technical field of high-voltage and large-capacity connection switch detection, in particular to a large-capacity experimental multifunctional power supply processing device and a large-capacity experimental detection apparatus for connectors.

BACKGROUND OF THE INVENTION

High-voltage and large-capacity connection switches include components such as circuit breakers, fuse protectors and the like. The circuit breakers are configured to remove short-circuit fault in the power system and to realize the normal switching on/off when the switching load operation is required. Arc process of breaking and closing a power system fault or a load is a complex process involving the interaction of electromagnetic fields, flow fields, and thermal fields, whatever for an AC circuit breaker or a DC circuit breaker. However, the theoretical research on arcs in the breaking process of circuit breakers still lags behind the actual needs. At present, it's difficult to develop a circuit break that meets various breaking capacities by means of theoretical analysis and quantitative calculation. Therefore, breaking and closing experiments of the circuit breaker are particularly important, which are a critical tool to study and evaluate various breaking and closing performances of the circuit breakers, and to check reasonability of the structural design, the manufacturing process and the material selection of the arc extinguishing chamber and other parts.

In the breaking experimental circuits of the AC large-capacity circuit breaker, a generator is used as the power source, an electric reactor is used as the experimental current adjustment element, and corresponding phase selection switches, circuit breakers and the measurement control parts are cooperated to form an experimental system. Terminal voltages and element parameters of the electric reactor may be selected according to the experimental requirements during the experiment. Specifically, the experimental circuits will be connected by a phase selection device, after an experimental circuit breaker breaks an experimental current set by a sample circuit breaker, a major experimental circuit will be cut off by an auxiliary circuit breaker. The phase selection switches in the conventional AC large-capacity circuit breakers generally are mechanical switches such as: permanent magnet vacuum circuit breakers, pneumatic circuit breakers, vacuum contactors and other phase selective execute components, which are suitable for the AC experimental circuits and configured to connect the power supply and the load circuit under a phase angle arbitrarily selected by the voltage waveform of the AC experimental power supply. While DC experimental circuits have a power supply composed of rectifier bridges, opening circuit breakers, closing circuit breakers, resistors, inductors and a data acquisition system. Specifically, the network source is stepped down by a transformer and then rectified into a DC source by the rectifier bridge, and then a required DC current is obtained by setting the corresponding resistors and inductors, finally the real-time DC voltage and DC current are effectively collected through the data acquisition system.

It can be seen that, first of all, the high-voltage and high-current phase selection switches currently used in the industry are mechanical contact switches, most of which use pneumatic control or permanent magnet operating mechanisms, thereby leading a complicated control, a high failure rate and poor repeatability due to the numerous intermediate total control devices to reduce the service life finally. Taking into consideration of the problems of contact material and assembly process, it's necessary to treat the ablated contact surface periodically, so as to avoid negative influence to the accuracy of phase selection and the success rate of the experiment. Moreover, the reliability and service life of the mechanical phase selection switches are partly reduced due to the complex transmission system and the ablated contact ablation.

Secondly, the experimental voltage level of the DC circuit breaker in the current experimental station is mostly lower than 2000V due to the large investment and low utilization rate of the high-voltage DC experimental circuits, in view of this, the short-circuit performance for the current high-voltage DC switches is verified by using low-frequency AC experiments to simulate DC experiments, which leads to a controversial experimental equivalence however.

Additionally, in the traditional AC experiments, two different and incompatible devices are utilized for realizing the phase selection and rectification, which belong to different experimental systems, have different principles and are independent one another, namely have no common circuit to realize the AC-DC experiment sharing. Accordingly, more sites and corresponding supporting facilities are required for the experimental station.

SUMMARY OF THE INVENTION

One objective of the present invention is to provide an experimental multifunctional power supply processing device, which integrates functions of phase selection of the AC experiments and rectification of the DC experiments for high-voltage large-capacity power connectors, and improves the adjustment accuracy and longevity of the phase selection switch.

Another objective of the present invention is to provide an experimental detection apparatus for connectors, which integrates functions of phase selection of the AC experiments and rectification of the DC experiments for high-voltage large-capacity power connectors, and improves the adjustment accuracy and longevity of the phase selection switch.

To achieve the above-mentioned objective, the present invention provides an experimental multifunctional power supply processing device, including:

three electric control valve groups configured to correspond to three phase electricity respectively, each of the electric control valve groups comprising at least two groups of current valve control components, a phase input terminal and a phase output terminal, each group of the current valve control components comprising a plurality of high-power controllable semiconductor switch tubes that are electrically connected together; and said at least two groups of current valve control components in any one of the electric control valve groups being in anti-parallel connection between the phase input terminal and a phase output terminal;

a positive output terminal;

a conversion control switch group, comprising a selection switch group and a connection switch group;

wherein the selection switch group is configured to selectively connect the current valve control components in each electric control valve group to the positive output terminal or the phase output terminal;

the connection switch group is configured to connect or disconnect a current path between two electric control valve groups connected one another;

the current valve control components in each electric control valve group is configured for phase selection or rectification, by controlling working states of the selection switch group and the connection switch group.

As one embodiment of the present invention, the controllable semiconductor switch tubes are thyristors.

As one embodiment of the present invention, a plurality of the controllable semiconductor switch tubes in each group of current valve control components are connected in a series and parallel manner, and a resistance-capacitance absorption circuit is connected in parallel at both ends of the controllable semiconductor switch tubes in each group of current valve control components and configured to limit a voltage rise rate of the controllable semiconductor switch tubes.

As one embodiment of the present invention, each of the electric control valve groups comprises a first valve group, a second valve group and a third valve group, and the connection switch group comprises a first switch electrically connected between the first valve group and the second valve group, and a second switch electrically connected between the second valve group and the third valve group.

As one embodiment of the present invention, the device further includes a control device connected in communication with the current valve control components and the conversion control switch group and configured to control working states of the current valve control components and the conversion control switch group.

As one embodiment of the present invention, the control device comprises a central controller and a signal acquisition device, a trigger control device and a switch control device that are connected in communication with the central controller; the signal acquisition device is configured to collect an input electrical signal or an output electrical signal of the electric control valve groups; the trigger control device is configured to send a trigger signal to the current valve control components to control the working state of the current valve control components; and the switch control device is configured to control the working states of different switches in the conversion control switch group.

As one embodiment of the present invention, the control device further comprises an unlocking control device connected in communication with the central controller and configured to lock or unlock the current valve control components.

As one embodiment of the present invention, the trigger control device comprises three independent trigger controllers connected in communication with the central controller, each of the trigger controllers is configured to correspond to one of the electric control valve groups.

As one embodiment of the present invention, each of the trigger controllers is connected in communication with the central controller through an optical fiber splitter, and the optical fiber splitter is configured to divide a trigger signal sent by the central controller into several paths and a respective parallel optical control signal corresponding to the controllable semiconductor switch tubes in a respective phase thereof.

The present invention further provides an experimental detection apparatus for connectors, including an experimental power supply, an experimental transformer, and the above-mentioned experimental multifunctional power supply processing device, wherein an output terminal of the experimental power supply is electrically connected to an input terminal of the experimental transformer, an output terminal of the experimental transformer is electrically connected to input terminals of the electric control valve groups, and outer terminals of the electric control valve groups are electrically connected to an experimental connector sample.

In comparison with the prior art, the present invention has following advantages.

1. The current valve control components in each electric control valve group corresponding to three phase electricity are composed of controllable semiconductor switch tubes, therefore, the current valve control components in each electric control valve group are suitable for phase selection or rectification, by controlling working states of the selection switch group and the connection switch group. In other words, the functions of phase selection and rectification of the experimental power supply are integrated together, which reduces the arrangements of the experimental circuits and improves the equipment utilization rate, thereby effectively reducing the experimental cost.
2. The power range of the electric control valve group is effectively guaranteed since multiple high-power controllable semiconductor switch tubes are electrically connected together, thereby ensuring the demand for high-voltage, large-capacity experimental circuits for both AC and DC.
3. The phase selection is realized by controlling the conducting state of the controllable semiconductor switch tubes and the degree of the conduction angle, which has long service life and high accuracy in comparison with phase selection method using mechanical contact switches.
4. Independent trigger controller and unlock controller are separately configured for each group of electric control valve group, and photoelectric isolation measures are cooperated as well, thus there is no electrical connection among control devices of different phases, so that the electrical isolation performance and anti-interference performance for the control devices of different phase are improved, thereby precisely controlling the trigger angle of the controllable semiconductor switch tubes.

DETAILED DESCRIPTION OF ILLUSTRATED EMBODIMENTS

A distinct and full description of the technical solution of the present invention will follow by combining with the accompanying drawings.

Figure 1:
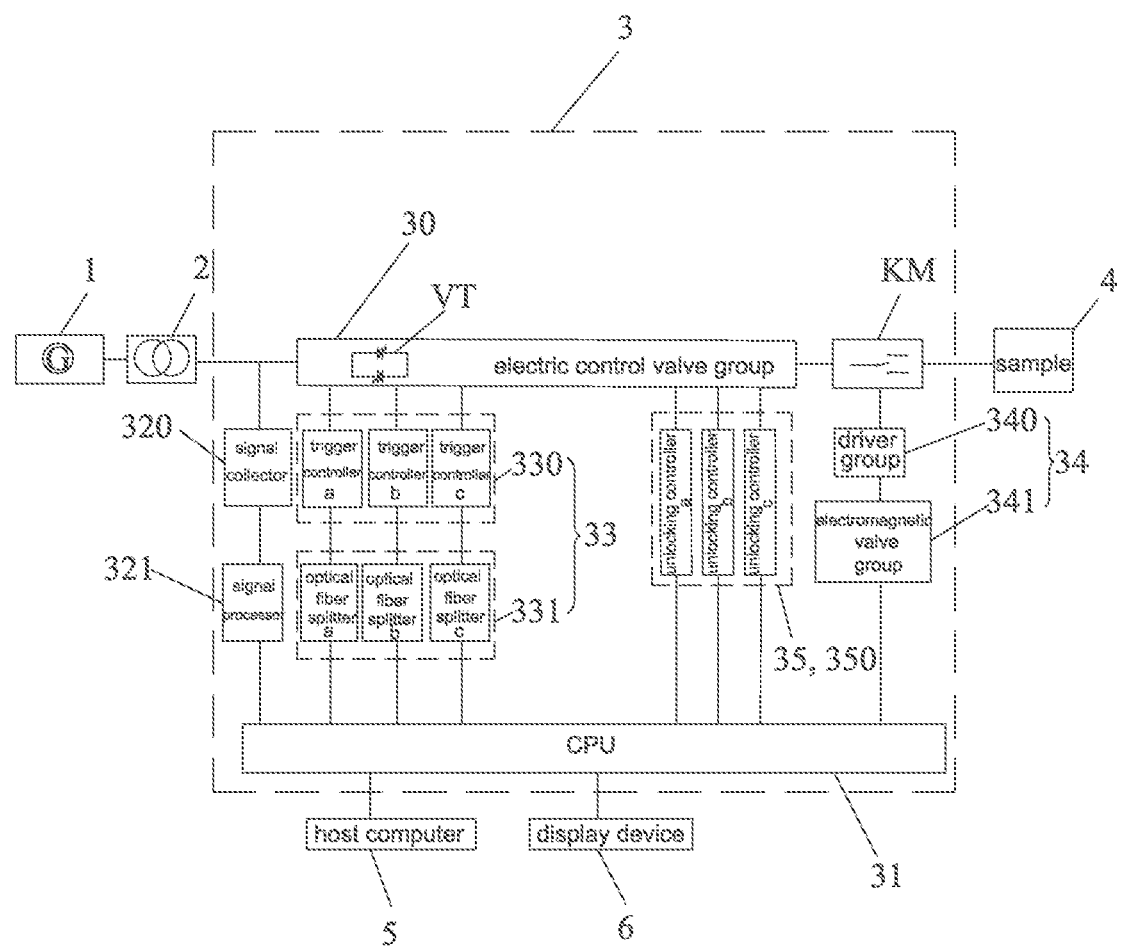
FIG. 1 is a schematic diagram of an experimental detection apparatus for connectors according to an embodiment of the present invention.

The present invention is to provide an experimental detection device for large-capacity connectors. The large-capacity connectors refer to connectors such as circuit breakers and fuse protectors applied in the high-power field of three-phase electricity. Such an experimental detection device is to judge the performance of the connectors by applying a high-voltage and large-capacity AC or DC experimental signal to the connectors. As shown in FIG. 1, the experimental detection device for connectors in this embodiment includes a large-capacity experimental power supply 1, an experimental transformer 2 and a power supply processing device 3. The output terminal of the experimental power supply 1 is electrically connected to the input terminal of the experimental transformer 2, the output terminal of the experimental transformer 2 is electrically connected to the input terminal of the power supply processing device 3, and the output terminal of the power supply processing device 3 is electrically connected to an experimental connector sample 4.

Figure 2:
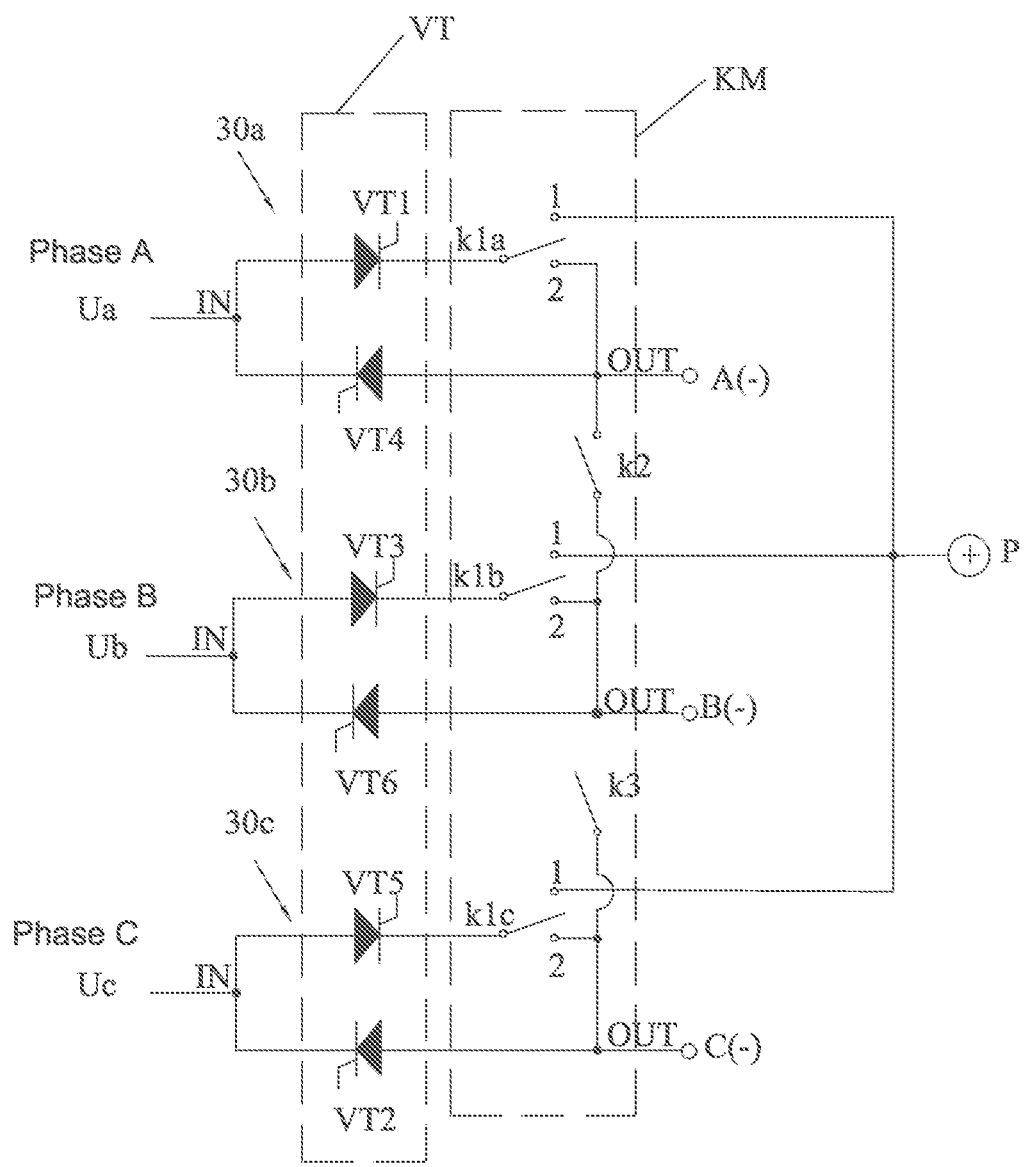
FIG. 2 is a schematic diagram of a circuit connection between an electric control valve group and a conversion control switch group according to an embodiment of the present invention.

Specifically, referring to FIGS. 1-2, the power processing device 3 includes three electric control valve groups 30 corresponding to three phase electricity, a positive output terminal P, and a conversion control switch group KM. The three electric control valve groups 30 in this embodiment are respectively a first valve group 30a, a second valve group 30b and a third valve group 30c. The first valve group 30a is electrically connected to phase A, the second valve group is electrically connected to phase B, and the third valve group 30c is electrically connected to phase C.

Each electric control valve group 30 includes at least two groups of current valve control components VT, a phase input terminal IN and a phase output terminal OUT. For the first valve group 30a, its phase input terminal IN is electrically connected to the output terminal Ua of phase A; for the second valve group 30b, its phase input terminal IN is electrically connected to the output terminal Ub of phase B; and for the third valve group 30c, its phase input terminal IN is electrically connected to the output terminal of phase C. Each group of current valve control components VT includes a plurality of high-power controllable semiconductor switch tubes that are electrically connected together. At least two groups of current valve control components VT in any one of the electric control valve groups 30 (such as two groups of current valve control components VT1 and VT4 in the first valve group 30a, two groups of current valve control components VT3 and VT6 in the second valve group 30b, two groups of current valve control components VT5 and VT2 in the third valve group are connected in anti-parallel connection between the phase electric input terminal IN and the phase output terminal OUT. The controllable semiconductor switches in this embodiment are preferably thyristors, which is not limited however. Alternatively, a giant transistor (GTR), an insulated gate bipolar transistor (IGBT), etc. may be selected. In the following embodiments, thyristors (VT1-VT6) are served as current valve control components VT.

As shown in FIG. 2, the conversion control switch group KM includes a selection switch group and a connection switch group. The selection switch group is configured to selectively connect the thyristor groups in each electric control valve group 30 to the positive output terminal P or the phase output terminal OUT. The connection switch group is configured to connect or disconnect the current path between the two electrically controlled valve groups 30 connected one another. When the power processing device 3 is configured for the function of phase selection, the connection switch group is operated to disconnect the electric control valve groups 30, and the selection switch group is operated to connect the thyristor groups in each electric control valve group 30 between the phase input terminal IN and the phase output terminal OUT, thereby controlling the conducting states of the thyristor groups in each phase to perform closing operation. When the power processing device 3 is configured for the function of rectification, the connection switch group is operated to connect the current path between the electric control valve groups 30, and the selection switch group is operated to connect the thyristors in each electric control valve group 30 between the corresponding phase input terminal IN and the positive output terminal P. In such a way, the electrical signal from each electric control valve group 30 can be full-wave rectified by two thyristor groups to output direct current.

Figure 3:
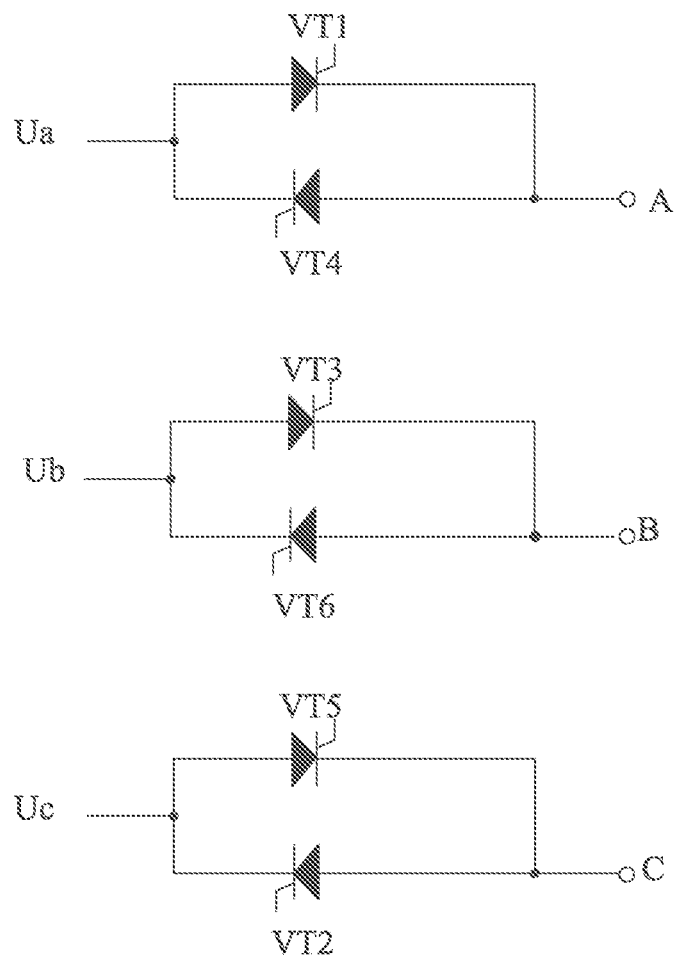
FIG. 3 is a schematic diagram of a circuit connection for performing a phase selection function of FIG. 2.
Figure 4:
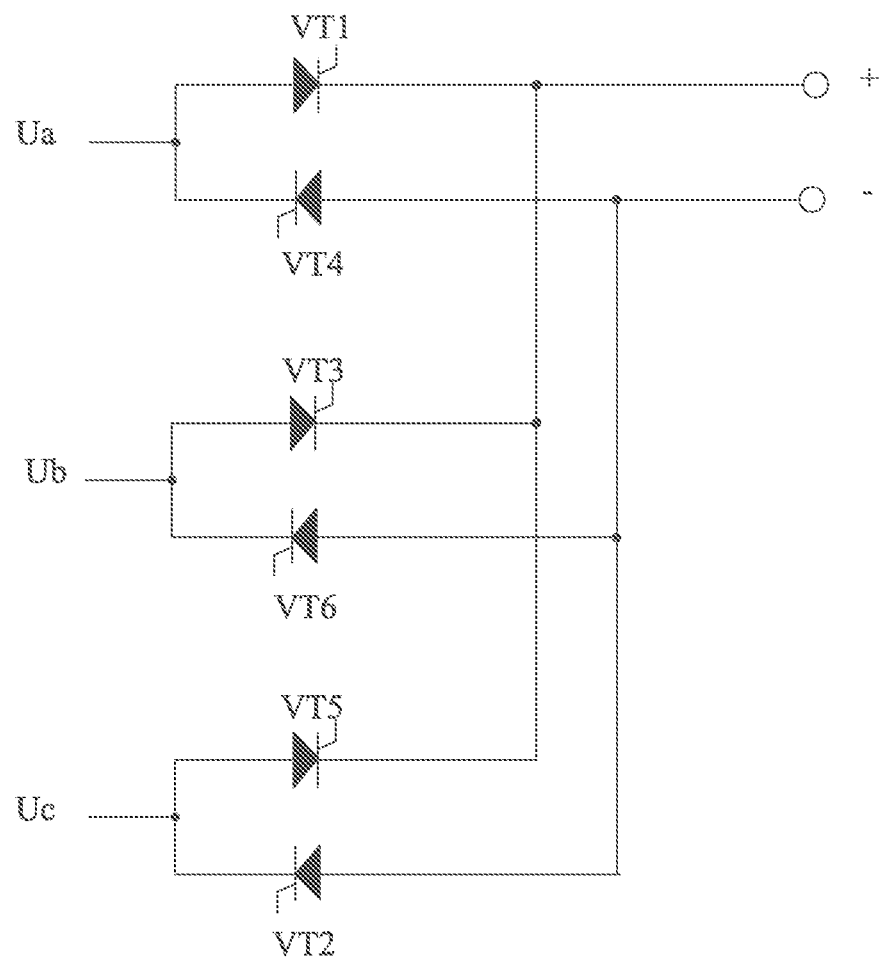
FIG. 4 is a schematic diagram of a circuit connection for performing rectification function of FIG. 2.

Further, as shown in FIG. 2, the selection switch group includes three selection switches K1a, K1b, K1c that are independent one another and correspond to each electric control valve group 30 respectively, and each selection switch in this embodiment includes two single pole single throw switches. The connection switch group includes a first switch K2 electrically connected between the first valve group 30a and the second valve group 30b and a second switch K3 electrically connected between the second valve group 30b and the third valve group 30c. When the power processing device 3 is configured for the rectification, the first switch K2 and the second switch K3 are closed, and meanwhile the active terminals of the selection switches K1a, K1b and K1c located in the three electric control valve groups 30 are connected at the contact point 1, to form a rectifier circuit as shown in FIG. 4. At this time, the thyristors are conducted when the trigger angle is equal to 0°, which are equivalent to diodes. When the power processing device 3 is configured for the function of phase selection, the first switch K2 and the second switch K3 are disconnected, and meanwhile the active terminals of the selection switches K1a, K1b and K1c located in the three electric control valve groups 30 are connected at the contact point 2, to form a phase selection circuit as shown in FIG. 3. At this time, the thyristors are used as AC three-phase closing switches. If one of the phases is selected, such as phase A is required for closing, then the thyristor groups in phase A is controlled to conduct, and the thyristor groups in phase B and phase C are disconnected; if two of the phases are selected, such as phase A and phase B are required for closing, then the thyristor groups in phase A and phase B are controlled to conduct, and the thyristor groups in phase C is disconnected; if three phases are required for conducting, then all of the thyristor groups in phases A, B and C are controlled to conduct. Therefore, based on the arrangement of the power processing device 3 in the above-mentioned embodiment, the thyristor groups in each electric control valve group 30 can be used not only for three-phase AC phase selection, but also for rectification, so as to convert high-voltage AC into high-voltage DC. In other words, the phase selection and the rectification of the experimental power supply 1 are combined, which reduces the layouts of the experimental circuits, improves the equipment utilization rate, and effectively saves the experimental cost accordingly. At the same time, the phase selection is realized by controlling the conducting state of the thyristors and the degree of the conduction angle, which has long service life and high accuracy in comparison with phase selection method using mechanical contact switches.

Figure 6:
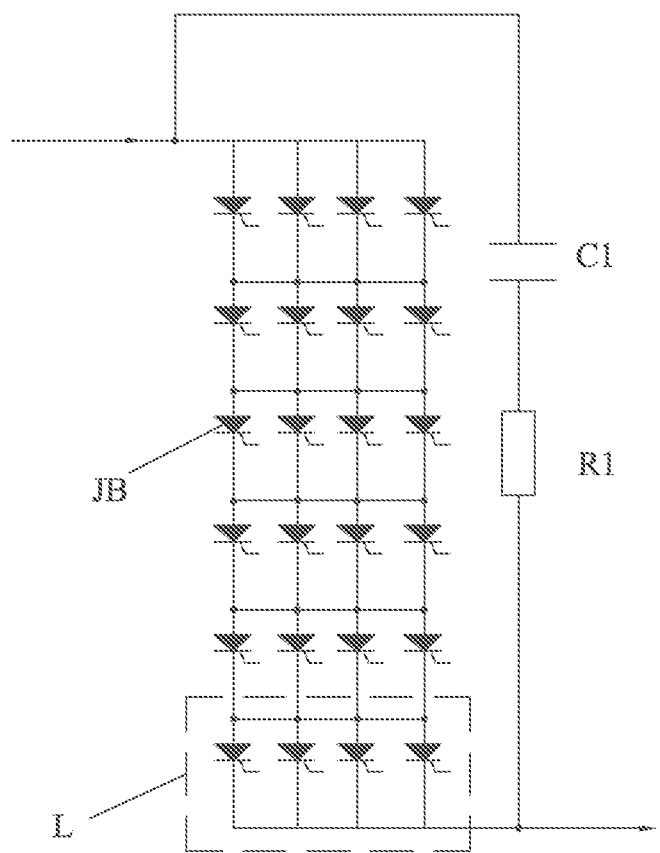
FIG. 6 is a schematic diagram of a plurality of thyristors in a thyristor group according to an embodiment of the present invention.

As shown in FIG. 6, in order to effectively ensure the tolerance capacity of the thyristor groups, the thyristors are connected in a series and parallel manner, and a resistance-capacitance absorption circuit is connected in parallel at both ends of each thyristor group, so as to limit the voltage rise rate of the thyristor groups, thus preventing the thyristors from conducting without a trigger signal. Specifically, the resistance-capacitance absorption circuit includes a capacitor C1 and a resistor R1 connected in series. In this embodiment, each thyristor group adopts a structure of six series connections and four parallel connections, that is, six series units L each of which has four thyristors JB connected in parallel are included.

Figure 5:
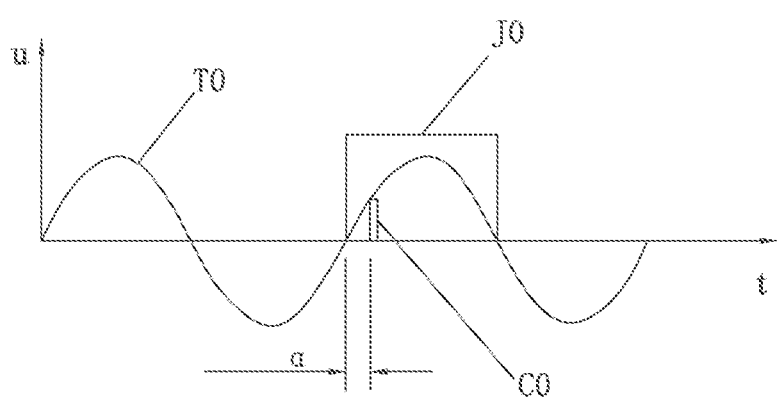
FIG. 5 is a schematic diagram of a triggering principle of a thyristor according to an embodiment of the present invention.

For further improvement, please refer to FIG. 1 again, the power processing device 3 also includes a control device communicated with the thyristor groups and the conversion control switch group KM, and configured to control the working states of the thyristor groups and the conversion control switch group KM, thereby facilitating the adjustment for the working state of the power processing device 3. Specifically, the control device includes a central controller 31 (CPU), a signal acquisition device communicated and connected to the central controller 31, a trigger control device 33 and a switch control device 34. The signal acquisition device is configured to acquire an input electrical signal or an output electrical signal of the electric control valve group 30. The trigger control device 33 is configured to send a trigger signal to the thyristor groups to control the working states of the thyristor groups. The switch control device 34 is configured to control the working states of different switches in the conversion control switch group KM. In this embodiment, the signal acquisition device includes a signal collector 320 (voltage or current transformer) and a signal processor 321. The signal collector 320 is configured to transmit the collected voltage or current signal to the signal processor 321, the signal processor 321 is configured to send the processed electrical signal to the central controller 31, and the central controller 31 is configured to record the experimental waveforms according to the electrical signal output by the signal processor 321 and detect a zero-crossing point of the experimental waveforms. By this token, the signal acquisition device in this embodiment is also served as a synchronization signal generator. Referring to FIG. 5, the electrical signal sent by the signal acquisition device and sent to the central controller 31 is used as a synchronization signal TO for the central controller 31 to generate the control signal, and according to the synchronization signal TO, the central controller 31 is configured to send a trigger signal C0 with a specific conduction angle α to the thyristor groups, so as to increase the control accuracy.

In order to avoid false triggering to the thyristors, as shown in FIG. 1 and FIG. 5, the control device further includes an unlocking control device 35 communicated and connected with the central controller 31, and the unlocking control device 35 is configured to lock or unlock the thyristor groups. A corresponding trigger action would be made once the thyristor groups receive an unlocking signal J0 sent by the unlocking control device 35 and a trigger signal C0 sent by the trigger control device 33 at the same time.

Further, the triggering control device 33 includes three independent trigger controllers 330 respectively connected in communication with the central controller 31, and each trigger controller 330 is configured to correspond to one group of electric control valve groups 30. Similarly, the unlocking control device includes three unlocking controllers 350 respectively connected in communication with the central controller 31, and each unlocking controller 350 is configured to correspond to one group of electric control valve groups 30. In this embodiment, since the thyristor groups of the three phases are independent one another, and one trigger controller 330 and one unlocking controller 350 are separately configured for the thyristor groups in each electric control valve group therefore the electrical isolation performance and the anti-interference performance among the control devices are improved, and it is convenient to independently control a respective electric control valve group 30 for a certain phase.

For the thyristor groups in each phase, multiple thyristors are connected in series and parallel manners so as to control the on-off of the large current, by this token, the requirement for the consistency of the trigger signals for controlling the on-off of the thyristors is high. In this regard, it is further improved that each trigger controller 330 is communicated and connected to the central controller 31 through an optical fiber splitter 331 which is configured to divide the trigger signal sent by the central controller 31 into several paths and a respective parallel optical control signal corresponding to the thyristors JB in the respective phase. In this embodiment, one digital pulse signal sent by the central controller 31 is transmitted to the optical fiber splitter 331, and then divided into several parallel optical signals by the optical fiber splitter 331 which are sent to the trigger controller 330, as a result, each thyristor JB in the thyristor groups is triggered by the trigger controller 330. Therefore, the trigger control consistency is realized by adjusting the width and duty ratio of the output pulse of the central controller 31, and the occurrence that only partial thyristors JB are triggered during use is avoided. In addition, due to the configuration of the optical fiber splitter 331, the trigger controller 330 can be optically isolated with the central controller 31, so as to avoid signal interferences to the central controller 31 from the thyristors.

In order to further illustrate the working principle of the above-mentioned power supply processing device 3, the following describes the phase selection and rectification process in detail:

Process of phase selection: as shown in FIGS. 2, 3 and 5, firstly, the central controller 31 controls the switch control device 34 to disconnect the first switch K2 and the second switch K3, and simultaneously connects the active terminals of the selection switches K1a, K1b and K1c in the three electric control valve groups 30 at the contact point 2. Then, the central controller 31 sends a trigger signal C0 with a conduction angle α to the fiber splitter 331 of the selected phase according to a synchronization signal TO collected by the signal acquisition device, and sends a unlocking signal J0 to the unlocking controller 35 of the selected phase, subsequently, the thyristor groups of the selected phase receives a rectangular unlocking pulse sent by the unlocking controller 35 and triggers a closing action at the selected phase in a next cycle, with the conduction angle α being adjusted within 0°-180°. When two phases or three phases are simultaneously selected for closing operation, the thyristor groups of the remaining selected phases will automatically trigger the closing action at the next zero-crossing point after a first thyristor group is closed, and then the thyristors remain in a fully conducting state until the central controller 31 sends out an opening command to perform an opening operation, or special circumstances such as power loss of the control devices occur.

Process of rectification: as shown in FIG. 2, FIG. 4, and FIG. 5, the central controller 31 controls the switch control device 34 to close the first switch K2 and the second switch K3, and simultaneously connects the active terminals of the selection switches K1a, K1b and K1c in the three electric control valve groups 30 at the contact point 1, as a result the thyristor groups of the three phases trigger the closing action at the zero-crossing point of three phases in the next cycle after receiving a rectangular pulse (namely a unlocking signal J0) from the central controller 31, thereby achieving the rectification.

Further, the conversion control switch group KM is used as the execution element for converting the AC phase selection and the rectification. To be understood that, electromagnetic interference signals are easily generated in the conversion process, thus it's necessary to safely isolate the switch control device 34. Specifically, as shown in FIG. 1, the switch control device 34 includes a driver group 340 for driving the selection switch group and the connection switch group, and an electromagnetic valve group 341 communicated and connected to the driver group 340 for controlling the action of the driver group 340. Further, the electromagnetic valve group 341 is communicated and connected to the central controller 31. In this embodiment, the driver group 340 includes a plurality of drivers respectively connected with each switch, and the electromagnetic valve group 341 includes a plurality of electromagnetic valves respectively connected with each driver. Specifically, the central controller 31 is configured to transmit a control signal to the electromagnetic valves, and the electromagnetic valves are configured to control the driver to make a corresponding action, so that the driver can be isolated from the central controller 31 by means of the electromagnetic valves. More specifically, the driver is preferably an air cylinder.

In addition, in order to facilitate the input of control commands to the central controller 31, a host computer 5 and a display device 6 may be connected to the central controller 31 for communication. Specifically, the host computer 5 is configured to input control commands to the central controller 31, and the display device 6 is configured to display experimental parameters.

In addition, it should be noted that, in order to prevent the power device from interfering with the control device, it's preferred that optical fiber communication is applied among the central controller 31, the signal acquisition device, the optical fiber splitter 331, the unlocking controller 350, the host computer 5 and the electromagnetic valve group 341 in the above control circuits.

To sum up, in the experimental detection apparatus for connectors according the embodiments of the present invention, the functions (phase selection or rectification) of the power supply processing device 3 can be adjusted by using the central controller 31 to control the conversion control switch group KM to sending a command for shifting the status for each switch. That is to say, the power supply processing device 3 may be operated under a phase selection status or a rectification status, so that both AC experiments and DC experiments of high voltage and large capacity may be performed to the connector sample 4 without changing the experimental site and experimental equipment, thereby effectively reducing the experimental cost. Secondly, when the power supply processing device 3 is used in DC experiments, the DC power is directly obtained by rectifying and transforming high-voltage and large-capacity AC power, thereby solving the problem of using AC experiments to simulate DC experiments due to insufficient capacity of DC experiments. In addition, due to the arrangement of the thyristor groups, the problem of the accuracy and repeatability of the closing phase selection and switch phase selection in the AC experiments are also solved.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An experimental multifunctional power supply processing device, comprising:
   three electric control valve groups configured to correspond to three phase electricity respectively, each of the three electric control valve groups comprising at least two groups of current valve control components, a phase input terminal and a phase output terminal, each group of the current valve control components comprising a plurality of high-power controllable semiconductor switch tubes that are electrically connected together; and said at least two groups of current valve control components in any one of the electric control valve groups being in anti-parallel connection between the phase input terminal and the phase output terminal;
   a positive output terminal; and
   a conversion control switch group, comprising a selection switch group and a connection switch group,
   wherein the selection switch group is configured to selectively connect the at least two groups of the current valve control components in each electric control valve group to the positive output terminal or the phase output terminal,
   the connection switch group is configured to connect or disconnect a current path between two of the three electric control valve groups connected one another, and
   the at least two groups of the current valve control components in each of the three electric control valve groups are configured for phase selection or rectification, by controlling working states of the selection switch group and the connection switch group.

2. The experimental multifunctional power supply processing device according to claim 1, wherein the controllable semiconductor switch tubes are thyristors.

3. The experimental multifunctional power supply processing device according to claim 1, wherein the plurality of the controllable semiconductor switch tubes in each group of the at least two groups of the current valve control components are connected in a series and parallel manner, and a resistance-capacitance absorption circuit is connected in parallel at both ends of the controllable semiconductor switch tubes in each group of current valve control components and configured to limit a voltage rise rate of the controllable semiconductor switch tubes.

4. The experimental multifunctional power supply processing device according to claim 1, wherein each of the three electric control valve groups comprises a first valve group, a second valve group and a third valve group, and the connection switch group comprises a first switch electrically connected between the first valve group and the second valve group, and a second switch electrically connected between the second valve group and the third valve group.

5. The experimental multifunctional power supply processing device according to claim 1, further comprising a control device connected in communication with the at least two groups of the current valve control components and the conversion control switch group and configured to control working states of the at least two groups of the current valve control components and the conversion control switch group.

6. The experimental multifunctional power supply processing device according to claim 5, wherein the control device comprises a central controller and a signal acquisition device, a trigger control device and a switch control device that are connected in communication with the central controller; the signal acquisition device is configured to collect an input electrical signal or an output electrical signal of the three electric control valve groups; the trigger control device is configured to send a trigger signal to the current valve control components to control the working state of the at least two groups of the current valve control components; and the switch control device is configured to control the working states of different switches in the conversion control switch group.

7. The experimental multifunctional power supply processing device according to claim 6, wherein the control device further comprises an unlocking control device connected in communication with the central controller and configured to lock or unlock the at least two groups of the current valve control components.

8. The experimental multifunctional power supply processing device according to claim 6, wherein the trigger control device comprises three independent trigger controllers connected in communication with the central controller, each of the trigger controllers is configured to correspond to one of the three electric control valve groups.

9. The experimental multifunctional power supply processing device according to claim 8, wherein each of the trigger controllers is connected in communication with the central controller through an optical fiber splitter, and the optical fiber splitter is configured to divide a trigger signal sent by the central controller into several paths and a respective parallel optical control signal corresponding to the controllable semiconductor switch tubes.

10. An experimental detection apparatus for connectors, comprising an experimental power supply, an experimental transformer, and the experimental multifunctional power supply processing device according to claim 1, wherein an output terminal of the experimental power supply is electrically connected to an input terminal of the experimental transformer, an output terminal of the experimental transformer is electrically connected to input terminals of the three electric control valve groups, and outer terminals of the three electric control valve groups are electrically connected to an experimental connector sample.

* * * * *